United States Patent
Chan et al.

(10) Patent No.: US 6,306,715 B1
(45) Date of Patent: Oct. 23, 2001

(54) METHOD TO FORM SMALLER CHANNEL WITH CMOS DEVICE BY ISOTROPIC ETCHING OF THE GATE MATERIALS

(75) Inventors: Lap Chan, San Francisco, CA (US); Elgin Quek, Singapore (SG); Ravi Sundaresan, San Jose, CA (US); Yang Pan; James Yong Meng Lee, both of Singapore (SG); Ying Keung Leung, Aberdeen (HK); Yelehanka Ramachandramurthy Pradeep; Jia Zhen Zheng, both of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/756,008

(22) Filed: Jan. 8, 2001

(51) Int. Cl.[7] ................ H01L 21/336; H01L 21/3205; H01L 21/302

(52) U.S. Cl. ............... 438/301; 438/303; 438/305; 438/586; 438/689

(58) Field of Search ................... 257/344, 408, 257/411, 346, 336, 900, 369, 322; 438/303, 305, 586, 689, 713, 739, 307, 301, 595, 666

(56) References Cited

U.S. PATENT DOCUMENTS

| | | | |
|---|---|---|---|
| 4,528,066 | * 7/1985 | Merkling, Jr. et al. | 156/643 |
| 5,210,435 | * 5/1993 | Roth et al. | 257/344 |
| 5,334,545 | 8/1994 | Caviglia | 437/41 |
| 5,416,033 | * 5/1995 | Lee et al. | 437/41 |
| 5,427,971 | * 6/1995 | Lee et al. | 437/44 |
| 5,620,912 | * 4/1997 | Hwang et al. | 438/301 |
| 5,650,343 | * 7/1997 | Luning et al. | 437/36 |
| 5,716,861 | * 2/1998 | Moslehi | 437/40 |
| 5,786,253 | * 7/1998 | Hsu | 438/275 |
| 5,840,611 | * 11/1998 | Lee et al. | 438/307 |
| 5,989,965 | * 11/1999 | Maa et al. | 438/303 |
| 6,037,630 | * 3/2000 | Igarashi et al. | 257/336 |
| 6,069,387 | * 5/2000 | Gardner | 257/344 |

* cited by examiner

Primary Examiner—Michael Lebentritt
(74) Attorney, Agent, or Firm—George O. Saile; Rosemary L. S. Pike; William J. Stoffel

(57) ABSTRACT

A method to form a MOS transistor with a narrow channel regions and a wide top (second) gate portion. A gate dielectic layer and a first gate layer are formed over a substrate. A second gate portion is formed over the first gate layer. Spacers are formed on the sidewalls of the second gate portion. In a critical step, we isotropically etch the first gate layer to undercut the second gate portion to form a first gate portion so that the first portion has a width less than the second gate portion. The spacers are removed. Lightly doped drains, sidewall spacers and source/drain regions are formed to complete the device.

14 Claims, 2 Drawing Sheets

METHOD TO FORM SMALLER CHANNEL WITH CMOS DEVICE BY ISOTROPIC ETCHING OF THE GATE MATERIALS

BACKGROUND OF INVENTION

1) Field of the Invention

This invention relates generally to fabrication of semiconductor devices and more particularly to the fabrication of a MOS transistors where the gate is etched to reduce the channel length.

2) Description of the Prior Art

As semiconductor devices are scaled down, there is a need to more accurately control the gate width and channel width. There is a need to find a process that allows channel regions and gate widths to more accurately controlled. There is also a need to find a process that allows channel regions and gate widths to more reduced below the lithographic limits.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,334,545(Caviglia) shows method for forming a gate and etching the poly bottom gate material.

U.S. Pat. No. 4,528,066(Merkling, Jr., et al.) shows process to eliminate undercutting under a gate.

U.S. Pat. No. 6,037,630(Igarashi et al.) shows a gate process.

U.S. Pat. No. 5,786,253(Hsu) shows a ROM cell with conductive lines.

SUMMARY OF THE INVENTION

It is an object of the present invention to provide a method for fabricating a MOS transistor that has a process that allows channel regions and gate widths to more accurately controlled.

It is an object of the present invention to provide a method for fabricating a MOS transistor that allows channel regions and gate widths to more reduced below the lithographic limits.

To accomplish the above objectives, the present invention provides a method of manufacturing a MOS transistor. The invention describes two embodiments of a method for forming a two layer gate, and etching the bottom gate material to undercut the top gate portion. The first embodiment uses a spacer. The second embodiment uses only a selective etch process, and no spacers.

The first embodiment of the invention is described as follows. A gate dielectric layer is formed over a substrate. Next, a first gate layer is formed over the gate dielectric layer. Subsequently, a second gate layer (blanket deposition) is formed over the first gate layer. We pattern the second gate layer to form a second gate portion over the first gate layer. Spacers are formed on the sidewalls of the second gate portion. In a critical step, we isotropically etch the first gate layer to undercut the second gate portion to form a first gate portion so that the first gate portion has a width less than the second gate portion. The first gate portion is narrower than the second gate portion. In a critical step, we remove the spacers. Next, we form lightly doped drains adjacent to the first gate portion and under the second gate portion. The lightly doped drain is formed using an angled ion implant so that the lightly doped drain is implanted under the second gate portion and the first gate portion. We form sidewall spacers on the sidewalls of the first and second gate portions. Next, we form source/drain regions adjacent to the sidewall spacers.

The second embodiment is described as follows. A gate dielectric layer is formed over a substrate. A first gate layer is formed over the gate dielectric layer. We form a second gate layer over the first gate layer. The second gate layer is patterned to form a second gate portion over the first gate layer. We isotropically etch the first gate layer to undercut the second gate portion to form a first gate portion so that the first gate portion has a width less than the second gate portion. The first gate portion is narrower than the second gate portion. We form a lightly doped drain adjacent to the first gate portion and under the second gate portion. A lightly doped drain is formed preferably using an angled ion implant so that the lightly doped drain is implanted under the second gate portion and the first gate portion. Sidewall spacers are formed on the sidewalls of the first and second gate portions. Source/drain regions are formed adjacent to the sidewall spacers.

The invention allows us to control the channel length by the thickness of the first gate layer and the amount of undercut from the isotropic etch of the first gate layer.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

I. First Embodiment

The first embodiment of the invention is shown in FIGS. 1 to 4 and is described as follows.

Figure 1:
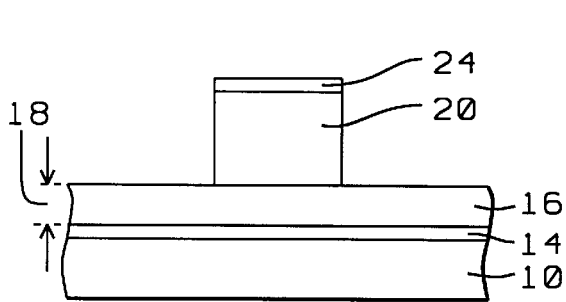
FIGS. 1 through 4 are cross sectional views for illustrating a first embodiment of the method for manufacturing a MOS transistor according to the present invention.

As shown in FIG. 1, we form a gate dielectric layer 14 over a substrate 10.

The gate dielectric layer 14 preferably is formed of silicon oxide, high k materials, (tantalum oxide (e.g., $Ta_2O_5$), silicon nitride (e.g., $Si_3N_4$), zirconium oxide (e.g., $ZrO_2$), Hafnium oxide (e.g., $HfO_2$) and titanium oxide (e.g., $TiO_2$).

Next, we form a first gate layer 16 over the gate dielectric layer 114. The first gate layer 16 preferably has a thickness 18 of between about 500 and 1000 Å.

The first gate layer 16 can be comprised of polysilicon or TiN or TaN and is most preferably comprised of polysilicon.

Subsequently, we form a second gate layer (blanket deposition) over the first gate layer 16. The second gate layer and the first gate layer preferably have an etch rate ratio greater than 5:1. That is, preferably we can etch the first gate layer faster than the second gate layer. The first and second gate layer preferably had ratio of thicknesses of the first gate layer to the second gate layer of between 0.5 and 2 times.

The second gate layer 20 is preferably comprised of Tungsten (W), Ta or Tungsten Silicide (WSi$_x$). The second gate layer 20 is most preferably comprised of WSi$_x$.

The second gate layer 20 preferably has a thickness of between about 500 and 1000 Å.

There are three preferred combinations (options) of the compositions of the gate dielectric layer, first and second gate layers.

TABLE 3 options for the gate dielectric layer, first and second gate layers.

| Layer | option 1 | option 2 | option 3 |
|---|---|---|---|
| second gate layer 20 | W | Ta | WSi$_x$ |
| First gate layer 16 | TiN | TaN | Polysilicon |
| gate dielectric | silicon oxide | Ta$_2$O$_5$ | silicon oxide |

An optional cap layer can be formed on the second gate layer. The cap layer is preferably comprised of silicon oxide.

As shown in FIG. 1, we pattern the second gate layer and cap layer to form a second gate portion 20 and cap layer 24 over the first gate layer 16. The second gate layer is preferably patterned by conventional photo resist mask and etch process.

Figure 2:
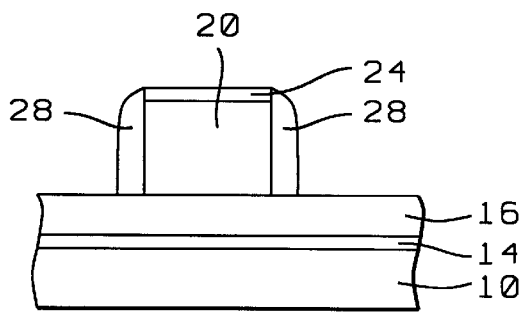

Referring to FIG. 2, we form (first) spacers 28 on the sidewalls of the second gate portion 20. The spacers 28 will act as an etch barrier in the subsequent isotropic etch. The spacers 28 are preferably comprised of silicon oxide, silicon nitride, or Silicon oxynitride (SiON) silicon oxide and preferably have a thickness of between about 200 and 600 Å. The spacers 28 are formed by depositing a blanket spacer layer over the surface and anisotropically etching the a blanket spacer layer.

Figure 3:
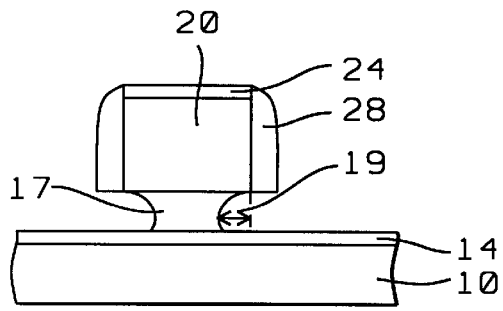

In a critical step, as shown in FIG. 3, using the spacers 28 as an etch mask, we isotropically etch the first gate layer 16 to undercut the second gate portion 20 to form a first gate portion 17 so that the first gate portion 17 has a width less than the second gate portion 20.

The isotropic etch preferably comprises a Cl$_2$/O$_2$ etch chemistry or SF$_6$/Cl$_2$/O$_2$ etch chemistry. The first gate portion 17 is narrower 19 than the second gate portion. The first gate portion 17 has a width between about 80 and 90% of the width of second gate portion 20. The width 19 is preferably about 5 to 10% of the width of the second gate portion 20.

The amount of undercutting of the first gate 17 is directly controlled by the thickness of the first gate 20 material. The undercutting (e.g., 19) will eliminate any poly bridging (e.g., shorting between poly lines) defects.

Also compared to the prior art, there is less damage of the thin gate dielectric. The prior art uses the anisotropic plasma etching (high density plasma) to etch the (first) gate layer and stops on the gate dielectric. The gate dielectric is damaged by the prior art's anisotropic plasma etching. In contrast, the invention uses an isotropic etch of the first gate layer. See FIG. 3. The gate dielectric is not damaged by the invention's isotropic etch.

Figure 4:
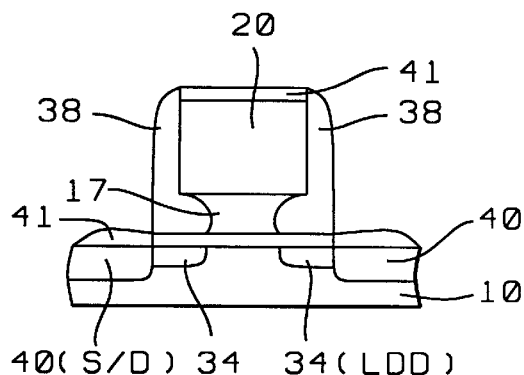

As shown in FIG. 4, in an optional but preferred step, we remove the (first) spacers 28. The spacers 28 can be removed for better second spacer 38 formation and for better LDD (high angled tilt) implantation. The inventor has found the removing the spacer 28 is a critical and highly preferred step because the second spacer 38 formation is better (e.g., device performance and reliability). The inventors have found that forming a second spacers over the first spacers do not have preferred results. The removal of the first spacers 28 before the second spacers 38 are formed yields better spacers.

Next, we form lightly doped drains 34 adjacent to the first gate portion and under the second gate portion 20. The lightly doped drain 34 is preferably formed using an angled ion implant so that the lightly doped drain is implanted under the second gate portion and the first gate portion.

As shown in FIG. 4, we form sidewall spacers 38 on the sidewalls of the first and second gate portions.

Next, we form source/drain regions 40 adjacent to the sidewall spacers 38.

Preferably the cap layer 24 over the gate 20 is removed or patterned to form an opening for a subsequently formed contact or silicide contact (e.g., 41)

Subsequently, silicide contacts 41 are made to the source/Drains 40 and the gate 20. The silicide contacts are preferably made of Co Silicide or Ni silicide. Preferably a salicide process is used.

The invention allows us to control the channel length by the thickness of the first gate layer and the amount of undercut from the isotropic etch of the first gate layer.

II. Second Embodiment

The invention's second embodiment is described below and shown in FIGS. 5 to 8.

The second embodiment uses the same or similar materials and processes as described above in the first embodiment unless otherwise noted.

Figure 5:
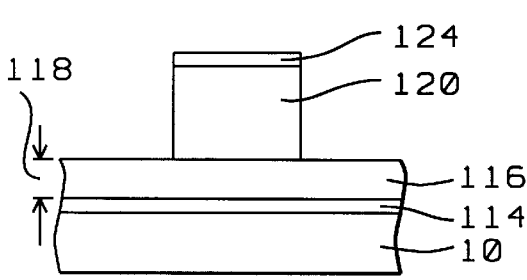
FIGS. 5 through 8 are cross sectional views for illustrating a second embodiment of the method for manufacturing a MOS transistor according to the present invention.

As shown in FIG. 5, we form a gate dielectric layer 114 over a substrate 10. The gate dielectric layer 114 is preferably formed of silicon oxide, silicon nitride, high K material, Ta$_2$O$_5$, ZrO$_2$, and TiO$_2$.

As shown in FIG. 5, we form a first gate layer 116 over the gate dielectric layer 114. The a first gate layer 116 has a thickness 118 of between about 500 and 1000 Å. The first gate layer 116 comprised of polysilicon.

As shown in FIG. 5, we form a second gate layer 120 over the first gate layer 16. The second gate layer and the first gate layer have an etch rate ratio greater than 5:1. That is we selected the gate materials so that we can etch the first gate layer faster (and selective to) the second gate layer.

The second gate layer preferably comprised of Tungsten, Ta or Tungsten silicide (WSi$_x$) and is more preferably of WSi$_x$.

The second gate layer has a thickness of between about 500 and 1000 Å.

As shown in FIG. 5, we pattern the second gate layer to form a second gate portion 18 over the first gate layer 16.

Figure 6:
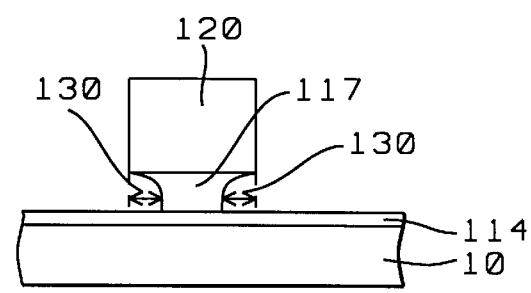

As shown in FIG. 6, we isotropically etch the first gate layer 116 to undercut the second gate portion 18 to form a first gate portion 117 so that the first gate portion 117 has a width less than the second gate portion 120. The isotropic etch comprising a Cl$_2$/O$_2$ or SF6/Cl$_2$/O$_2$ etch chemistry.

The first gate portion 117 is narrower than the second gate portion 20 by a width 130 between about 10 and 20%. For example if the gate 20 is 1 unit then the gate 17 is between 0.8 and 0.9 unit.

Figure 7:
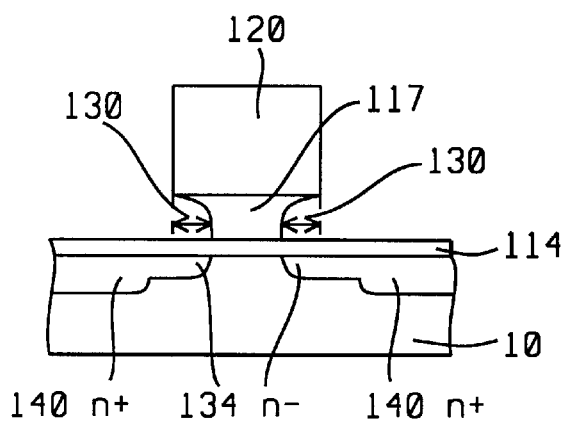

As shown in FIG. 7, we form a lightly doped drain 134 adjacent to the first gate portion and under the second gate portion 120.

A lightly doped drain 134 formed using an angled ion implant so that the lightly doped drain 134 is implanted under the second gate portion and the first gate portion.

Figure 8:
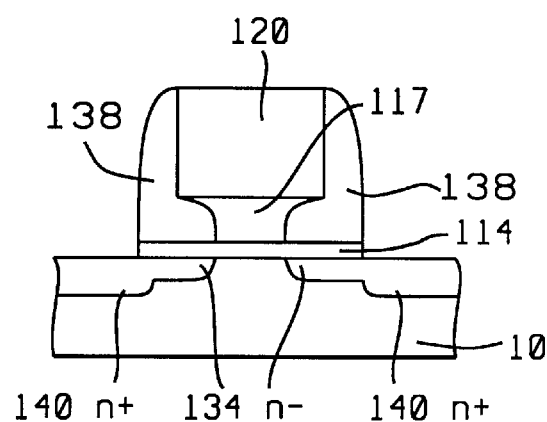

As shown in FIG. 8, we form sidewall spacers 138 on the sidewalls of the first and second gate portions.

Still referring to FIG. 8, we form source/drain regions 140 adjacent to the sidewall spacers.

The invention allows us to control the channel length by the thickness of the first gate layer and the amount of undercut from the isotropic etch of the first gate layer.

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor. Specific terminology of particular importance to the description of the present invention is defined below.

Within the present invention, the substrate may be a substrate employed within a microelectronics fabrication selected from the group including but not limited to integrated circuit microelectronics fabrications, solar cell microelectronics fabrications, ceramic substrate microelectronics fabrications and flat panel display microelectronics fabrications. Although not specifically illustrated within the schematic cross-sectional diagram of FIG. 1, the substrate 10 may be the substrate itself employed within the microelectronics fabrication, or in the alternative, the substrate may be the substrate employed within tile microelectronics fabrication, where the substrate has formed thereupon or thereover any of several additional microelectronics layers as are conventionally employed within the microelectronics fabrication. Such additional microelectronics layers may include, but are not limited to, microelectronics conductor layers, microelectronics semiconductor layers and microelectronics dielectric layers.

As used in the subject invention, etching refers to chemically eating away a material to form a desired pattern. Selectively etching refers to the use of etching to remove selected portions of one material from another in a semiconductor structure.

Silicon, as used in this application, includes polysilicon (polycrystalline silicon), amorphous silicon (non-crystalline silicon), monocrystalline silicon and silicon/germanium materials. Such silicon may be n- or p-doped, or undoped.

CVD refers to chemical vapor deposition. LPCVD refers to low pressure chemical vapor deposition. Ion implantation refers to the implantation of ions, for example, for doping a semiconductor substrate.

Oxide as used in the subject invention refers to silicon oxides and nitride as used herein refers to silicon nitride. The oxide may be doped or undoped, such as PSG phosphosilicate glass) or BPSG (boron & phosphorous doped silicate glass). An insulation layer or insulator layer refers to a layer having a high resistivity, which does not conduct electricity. It may act as a sodium barrier.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

Unless explicitly stated otherwise, each numerical value and range should be interpreted as being approximate as if the word about or approximately preceded the value of the value or range.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of CMOS transistor having a smaller channel; comprising the steps of:
    a) forming a gate dielectric layer over a substrate;
    b) forming a first gate layer over said gate dielectric layer;
    c) forming a second gate layer over said first gate layer;
    d) patterning said second gate layer to form a second gate portion over said first gate layer;
    e) forming spacers on the sidewalls of said second gate portion;
    f) isotropically etching said first gate layer to undercut said second gate portion to form a first gate portion so that said first gate portion has a width less than said second gate portion;
    g) removing said spacers;
    h) forming lightly doped drains adjacent to said first gate portion and under said second gate portion;
    i) forming sidewall spacers on the sidewalls of said first and second gate portions; and
    j) forming source/drain regions adjacent to said sidewall spacers.

2. The method of claim 1 wherein said second gate layer and said first gate layer have a etch rate ratio of greater than 5:1.

3. The method of claim 1 wherein said gate dielectric layer formed of a material selected from the group consisting of silicon oxide, tantalum oxide, silicon nitride, zirconium oxide, Hafnium oxide and titanium oxide.

4. The method of claim 1 wherein said a first gate layer has a thickness of between about 500 and 1000 Å.

5. The method of claim 1 wherein said first gate layer is comprised of polysilicon and said second gate layer comprised of tungsten silicide.

6. The method of claim 1 wherein said second gate layer is comprised of Ta.

7. The method of claim 1 wherein said second gate layer is comprised of Ta, the first gate layer is comprised of TaN and the gate dielectric layer is comprised of Tantalum Oxide.

8. The method of claim 1 wherein said second gate layer having a thickness of between about 500 and 1000 Å.

9. The method of claim 1 wherein said spacers are comprised of silicon oxide and have a thickness of between about 200 and 600 Å.

10. The method of claim 1 wherein the isotropic etch comprises a $Cl_2/O_2$ etch chemistry or $SF_6/Cl_2/O_2$ etch chemistry.

11. The method of claim 1 wherein said first gate portion is narrower than said second gate portion by between about 10 to 20% of the width of the second gate portion.

12. The method of claim 1 wherein said a lightly doped drain formed using an angled ion implant so that the lightly doped drain is implanted under the second gate portion and said first gate portion.

13. A method of fabrication of CMOS transistor having a smaller channel, comprising the steps of:
    a) forming a gate dielectric layer over a substrate;
    b) gate dielectric layer formed of a material selected from the group consisting of silicon oxide, tantalum oxide, silicon nitride, zirconium oxide, Hafnium oxide and titanium oxide;
c) forming a first gate layer over said gate dielectric layer;
   (1) said a first gate layer has a thickness of between about 500 and 1000 Å;
   (2) said first gate layer comprised of polysilicon, TiN or Ta;
d) forming a second gate layer over said first gate layer; said second gate layer and said first gate layer have an etch rate ratio greater than 5:1;
   (1) said second gate layer comprised of W, Ta, or tungsten silicide;
   (2) said second gate layer having a thickness of between about 500 and 1000 Å;
e) forming a cap layer over said second gate layer; said cap layer comprised of silicon oxide;
f) patterning said second gate layer and said cap layer to form a cap and a second gate portion over said first gate layer;
g) forming spacers on the sidewalls of said second gate portion;
   (1) said spacers are comprised of silicon oxide and have a thickness of between about 200 and 600 Å;
h) isotropically etching said first gate layer to undercut said second gate portion to form a first gate portion so that said first gate portion has a width less than said second gate portion;
   (1) the isotropic etch comprising a $Cl_2/O_2$ etch chemistry or $SF_6/Cl_2/O_2$ etch chemistry;
   (2) said first gate portion is narrower than said second gate portion by between about 10 to 20%;
i) removing said spacers;
j) forming lightly doped drains adjacent to said first gate portion and under said second gate portion;
   (1) said lightly doped drains formed using an angled ion implant so that the lightly doped drain is implanted under the second gate portion and said first gate portion;
k) forming sidewall spacers on the sidewalls of said first and second gate portions; and
l) forming source/drain regions adjacent to said sidewall spacers.

14. The method of claim 13 which further includes forming silicide contacts to said source/drain regions and said second gate portion.

* * * * *